United States Patent [19]
Sato

[11] Patent Number: 6,130,560
[45] Date of Patent: Oct. 10, 2000

[54] SENSE AMPLIFIER CIRCUIT

[75] Inventor: Fumihiko Sato, Tokyo, Japan

[73] Assignee: NEC Corporation, Tokyo, Japan

[21] Appl. No.: 09/281,048

[22] Filed: Mar. 30, 1999

[30]     Foreign Application Priority Data

Mar. 30, 1998  [JP]  Japan .................................. 10-083181

[51] Int. Cl.[7] ................................................. G11C 7/06
[52] U.S. Cl. ............................................... 327/57; 327/55
[58] Field of Search ......................................... 327/51–57

[56]          References Cited

U.S. PATENT DOCUMENTS 5,508,644  4/1996  Branson et al. ........................... 327/57
5,646,905  7/1997  Pogrebnoy .
5,729,499  3/1998  Fujiwara et al. .
5,828,239  10/1998  Lotfi ........................................... 327/57
5,834,953  11/1998  Glass et al. ................................ 327/55

*Primary Examiner*—Toan Tran
*Attorney, Agent, or Firm*—Scully, Scott, Murphy & Presser

[57]              ABSTRACT

The present invention provides a circuitry comprising: at least a sense amplifier further comprising at least a pair of invertor circuits having output sides connected to output invertors; and a control circuit connected to the sense amplifier and the output invertors for performing at least one of the following operations: returning output signals from the output invertors to the sense amplifier when the sense amplifier is activated; and disconnecting the output invertors from the sense amplifier when the sense amplifier is inactivated.

4 Claims, 4 Drawing Sheets

SENSE AMPLIFIER CIRCUIT

BACKGROUND OF THE INVENTION

The present invention relates to a sense amplifier circuit, and more particularly to a sense amplifier circuit for amplifying a current read out from a memory cell for use in a semiconductor memory device and improved in high speed performance of a read out operation.

FIG. 1 is a circuit diagram illustrative of a conventional sense amplifier circuit having an invertor at an output portion. Read bus lines RBT and RBB are connected to digit lines TRUE and BAR respectively. A potential difference is generated based upon read out data from the memory cells in read-out operation and the potential difference is transferred through p-channel MOS field effect transistors P4 and P5 to a sense amplifier SA. A circuit configuration including p-channel MOS field effect transistors P1, P2 and P3 serves as a pre-charge equalizer for pre-charge equalizing the read bus lines RBT and RBB. The above p-channel MOS field effect transistors P4 and P5 connect the lead bus lines RBT and RBB to the sense amplifier SA for transferring the potential difference between the lead bus lines RBT and RBB to the sense amplifier, so as to disconnect the lead bus lines RBT and RBB from the sense amplifier SA at the same time when the sense amplifier SA is activated upon a signal SE2. Further, p-channel MOS field effect transistors P6 and P7 are provided at output portions X2 and X1 respectively of the sense amplifier SA, so that upon receipt of a signal SAEQ, the sense amplifier SA is pre-charged to inactivate the sense amplifier SA.

The sense amplifier SA comprises p-channel MOS field effect transistors P8 and P9 and n-channel MOS field effect transistors N1, N2 and N3. Namely, the sense amplifier circuit is a full-latch sense amplifier which comprises a first invertor comprising the p-channel MOS field effect transistor P8 and the n-channel MOS field effect transistor N1 and a second invertor comprising the p-channel MOS field effect transistor P8 and the n-channel MOS field effect transistor N2. The signal SE1 is inputted into a gate of the n-channel MOS field effect transistor N3. The signal SE2 is inputted into sources of the p-channel MOS field effect transistors P8 and P9. The sense amplifier SA is activated by the signals SE1 and SE2.

Further, invertors I1 and I3 are connected to the output portions X2 and X1 of the sense amplifier SA. The invertor I2 outputs a signal with the same phase as the invertor I3. Output terminals of the invertors I2 and I3 are connected to gates of p-channel MOS field effect transistor P10 and n-channel MOS field effect transistor N4. The p-channel MOS field effect transistor P10 and the n-channel MOS field effect transistor N4 are connected through a connecting point to each other and a WRB line is connected to this connecting point, so that an output signal of high or low "H" or "L" appears on this WRB line.

Prior to the read out operation, the signals SAEQ, SE1 and SE2 are in the low level "L". The signal SAEQ is changed from the low level "L" to the high level "H", so that the p-channel MOS field effect transistors P1–P3, P6 and P7 turn OFF, whereby the potential difference between the read bus lines RBT and RBB becomes transferable to the sense amplifier SA. The word line is then selected to fetch data from the cell connected to the selected word line, whereby the read bus lines RBB and RBT are opened to cause the potential difference to be transferred to the sense amplifier SA. Subsequently, the signal SE1 is changed from the low level "L" to the high level "H", so that the n-channel MOS field effect transistor N3 turns ON. The signal SE2 is then changed from the low level "L" to the high level "H" thereby activating the sense amplifier SA and concurrently the p-channel MOS field effect transistors P4 and PS turn OFF, whereby the read bus lines RBT and RBB become disconnected from the sense amplifier SA. As described above, the sense amplifier SA comprises the first invertor circuit and the second invertor circuit. The activated sense amplifier SA amplifiers data on the read bus lines RBT and RBB to define the data, whereby the output from the sense amplifier SA is transferred through the invertors I1, I2 and I3 to the p-channel MOS field effect transistor P10 and the n-channel MOS field effect transistor N4, so that a high "H" or low "L" output appears on the WRB.

In the above conventional sense amplifier circuit, the invertors I1, I2 and I3 are provided between the read bus lines RBT and RBB and the output transistors P10 and N4, for which reason those invertors cause signal transmission delays, thereby making it difficult to improve the high sped performance of the sense amplifier circuit. In order to reduce the signal transmission delay, it is effective to enlarge the size of the invertor circuits. This enlargement in size of the invertor circuits, however, causes an enlargement in occupied area of the invertor circuits, thereby making it difficult to satisfy the requirements for scaling down of the sense amplifier circuit as well as for increase the density of integration of the sense amplifier circuit. The individual invertors also serve as loads to the read bus lines RBT and RBB, whereby the output signals are delayed, thereby making it difficult to improve the high speed performance of the sense amplifier circuit.

In the above circumstances, it had been required to develop a novel sense amplifier Circuit free from the above problems.

SUMMARY OF THE INVENTION

Accordingly, it is an object of the present invention to provide a novel sense amplifier circuit free from the above problems.

It is a further object of the present invention to provide a novel sense amplifier circuit free from an output signal delay due to the invertor circuits connected to read bus lines.

It is a still further object of the present invention to provide a novel sense amplifier circuit improved in high speed performance of an output operation.

The present invention provides a circuitry comprising: at least a sense amplifier further comprising at least a pair of invertor circuits having output sides connected to output invertors; and a control circuit connected to the sense amplifier and the output invertors for performing at least one of the following operations: returning output signals from the output invertors to the sense amplifier when the sense amplifier is activated; and disconnecting the output invertors from the sense amplifier when the sense amplifier is inactivated.

It is preferable that the control circuit comprises at least a switching circuit connected between output side of the sense amplifier and input terminals of the output invertors.

It is also preferable that the control circuit comprises at least a first switching circuit connected between a first read bus line connected to an input side of the sense amplifier and an input side of one of the output invertor and a second switching circuit connected between a second read bus line connected to an output side of the sense amplifier and an input side of other of the output invertor, so that the first and second switching circuits are operated to return output signals from the output invertors to the sense amplifier when the sense amplifier is activated and disconnect the output invertors from the sense amplifier when the sense amplifier is inactivated.

It is also preferable that the control circuit comprises: a first switching circuit connected between a first output terminal of the sense amplifier and an input terminal of the first output invertor; a second switching circuit connected between a second output terminal of the sense amplifier and an input terminal of the second output invertor; a third switching circuit connected between a first read bus line connected to an input side of the sense amplifier and an input terminal of the first output invertor; and a fourth switching circuit connected between a second read bus line connected to an output side of the sense amplifier and an input terminal of the second output invertor, so that the first, second, third and fourth switching circuits are operated to turn ON when the sense amplifier is activated and turn OFF when the sense amplifier is inactivated.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

PREFERRED EMBODIMENTS

Figure 1:
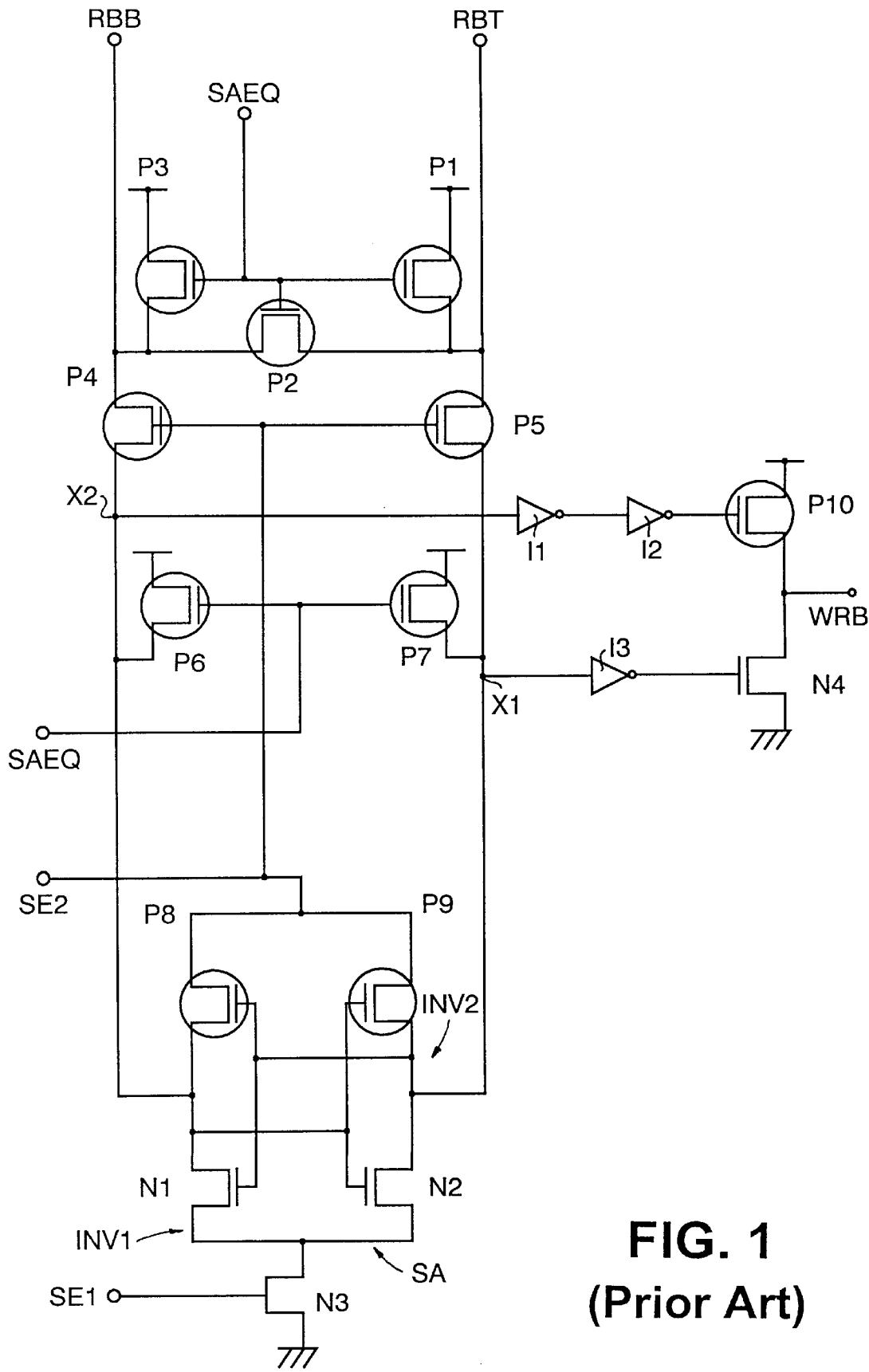
FIG. 1 is a circuit diagram illustrative of a conventional sense amplifier circuit having an invertor at an output portion.
Figure 2:
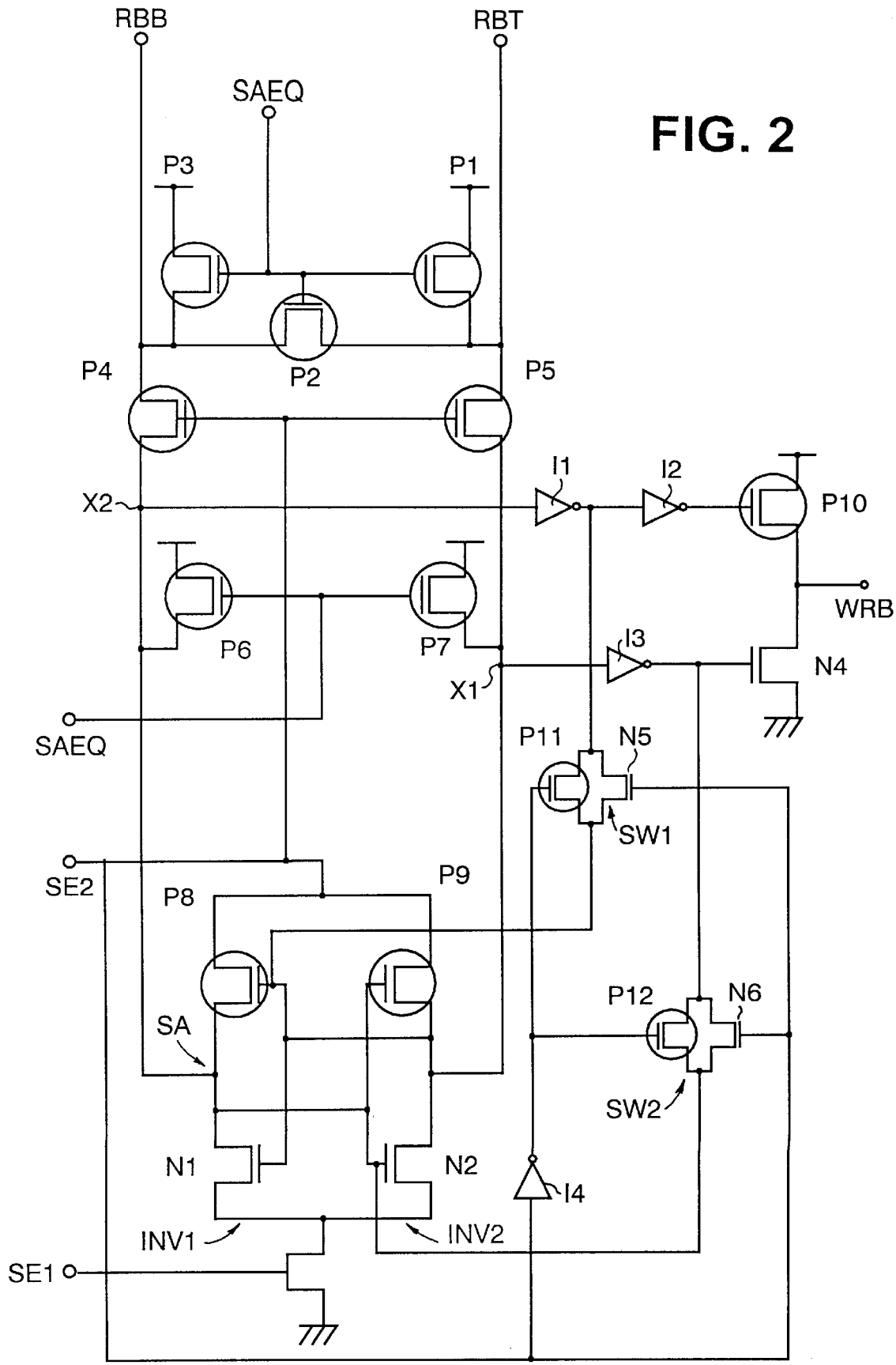
FIG. 2 is a circuit diagram illustrative of a first novel sense amplifier circuit in a first embodiment in accordance with the present invention.

First Embodiment:

A first embodiment according to the present invention will be described in detail with reference to FIG. 2 which is a circuit diagram illustrative of a first novel sense amplifier circuit. Read bus lines RBT and RBB are connected to digit lines TRUE and BAR respectively. A potential difference between the read bus lines RBT and RBB is generated based upon read out data from the memory cells in read-out operation and the potential difference is transferred through p-channel MOS field effect transistors P4 and P5 to a sense amplifier SA. A circuit configuration including p-channel MOS field effect transistors P1, P2 and P3 serves as a pre-charge equalizer for pre-charge equalizing the read bus lines RBT and RBB. The above p-channel MOS field effect transistors P4 and P5 connect the lead bus lines RBT and RBB to the sense amplifier SA for transferring the potential difference between the lead bus lines RBT and RBB to the sense amplifier, so as to disconnect the lead bus lines RBT and RBB from the sense amplifier SA at the same time when the sense amplifier SA is activated upon a signal SE2. Further, p-channel MOS field effect transistors P6 and P7 are provided at output portions X1 and X2 respectively of the sense amplifier SA, so that upon receipt of a signal SAEQ, the sense amplifier SA is pre-charged to inactivate the sense amplifier SA.

The sense amplifier SA comprises p-channel MOS field effect transistors P8 and P9 and n-channel MOS field effect transistors N1, N2 and N3. Namely, the sense amplifier circuit is a full-latch sense amplifier which comprises a first invertor circuit INV1 comprising the p-channel MOS field effect transistor P8 and the n-channel MOS field effect transistor N1 and a second invertor circuit INV2 comprising the p-channel MOS field effect transistor P9 and the n-channel MOS field effect transistor N2. The signal SE1 is inputted into a gate of the n-channel MOS field effect transistor N3. The signal SE2 is inputted into sources of the p-channel MOS field effect transistors P8 and P9. The sense amplifier SA is activated by the signals SE1 and SE2.

Further, invertors I1 and I3 are connected to the output portions X2 and X1 of the sense amplifier SA. The invertor I2 is connected in series to the invertor I1. The invertor I2 outputs a signal with the same phase as the invertor I3. Output terminals of the invertors I2 and I3 are connected to gates of p-channel MOS field effect transistor P10 with a source connected to a power source and n-channel MOS field effect transistor N4 with a source grounded, The p-channel MOS field effect transistor P10 and the n-channel MOS field effect transistor N4 are connected through a connecting point to each other and an output line WRB is connected to this connecting point, so that an output signal of high or low "H" or "L" appears on this output line WRB. The p-channel MOS field effect transistor P10 or the n-channel MOS field effect transistor N4 turns ON in accordance with the output from the invertors I2 and I3, whereby the output signal of "H" or "L" appears on the output line WRB.

Output terminals of the invertors I1 and I3 are connected to first and second transfer switches SW1 and SW2. The first transfer switch SW1 comprises a parallel connection of a p-channel. MOS field effect transistor P11 and an n-channel MOS field effect transistor N5. The second transfer switch SW2 comprises a parallel connection of a p-channel MOS field effect transistor P12 and an n-channel MOS field effect transistor N6. A first side of the parallel connection of the first transfer switch SW1 is connected to the output terminal of the invertor I1 and a second side of the parallel connection of the first transfer switch SW1 is connected to an output terminal of the first invertor circuit INV1. A second side of the parallel connection of the second transfer switch SW2 is connected to the output terminal of the invertor I3 and a second side of the parallel connection of the second transfer switch SW2 is connected to an output terminal of the second invertor circuit INV2. Gates of the n-channel MOS field effect transistors N5 and N6 receive the signal SE2. Gates of the p-channel MOS field effect transistors P11 and P12 receive an inverted signal to the signal SE2 through an invertor I4. When the first and second transfer switches SW1 and SW2 turn ON, the output terminals of the investors I1 and I3 are connected to the input sides of the first and second invertor circuits INV1 and INV2 respectively.

Prior to the read out operation, the signals SAEQ, SE1 and SE2 are in the low level "L". The signal SAEQ is changed from the low level "L" to the high level "H", so that the p-channel MOS field effect transistors P1–P3, P6 and P7 turn OFF, whereby the potential difference between the read bus lines RBT and RBB becomes transferable to the sense amplifier SA. The word line is then selected to fetch data from the cell connected to the selected word line, whereby the read bus lines RBB and RBT are opened to cause the potential difference to be transferred to the sense amplifier SA. Subsequently, the signal SE1 is changed from the low level "L" to the high level "H", so that the n-channel MOS field effect transistor N3 turns ON. The signal SE2 is then changed from the low level "L" to the high level "H" thereby activating the sense amplifier SA and concurrently the p-channel MOS field effect transistors P4 and P5 turn OFF, whereby the read bus lines RBT and RBB become disconnected from the sense amplifier SA. Further concurrently, the first and second transfer switches SW1 and SW2 turn ON, whereby the outputs of the invertors I1 and I3 become connected to the inputs of the first and second invertor circuits INV1 and INV2. As described above, the activated sense amplifier SA becomes to have a full-latch sense amplifier circuit configuration which comprises a first parallel connection of the first invertor circuit INV1 and the invertor I3 and a second parallel connection of the second invertor circuit INV2 and the invertor I1. Data are defined. The output from the sense amplifier SA is transferred through the invertors I1, I2 and I3 to the gates of the p-channel MOS field effect transistor P10 and the n-channel MOS field effect transistor N4, whereby an output high "H" or low "L" appears on the output line WRB.

In the above novel sense amplifier circuit, when the sense amplifier SA is activated, this sense amplifier becomes to have parallel connections of the two invertors, whereby the invertor size is apparently enlarged. This makes it possible to improve the high speed performance of the output on the output line WRB as omitting the invertor on the single output stage. This novel sense amplifier circuit is improved in the high speed performance by 80 ps as compared to the conventional sense amplifier circuit.

The above novel sense amplifier circuit has the circuit configuration for returning the output from the invertor connected to the output terminal of the sense amplifier to the sense amplifier when the sense amplifier is activated, whereby the sense amplifier circuit becomes to have the two parallel connection of the two invertor circuits. As a result, the invertor size in the sense amplifier is apparently enlarged. This makes it possible to improve the high speed performance of the output on the output line WRB as omitting the invertor on the single output stage.

Figure 3:
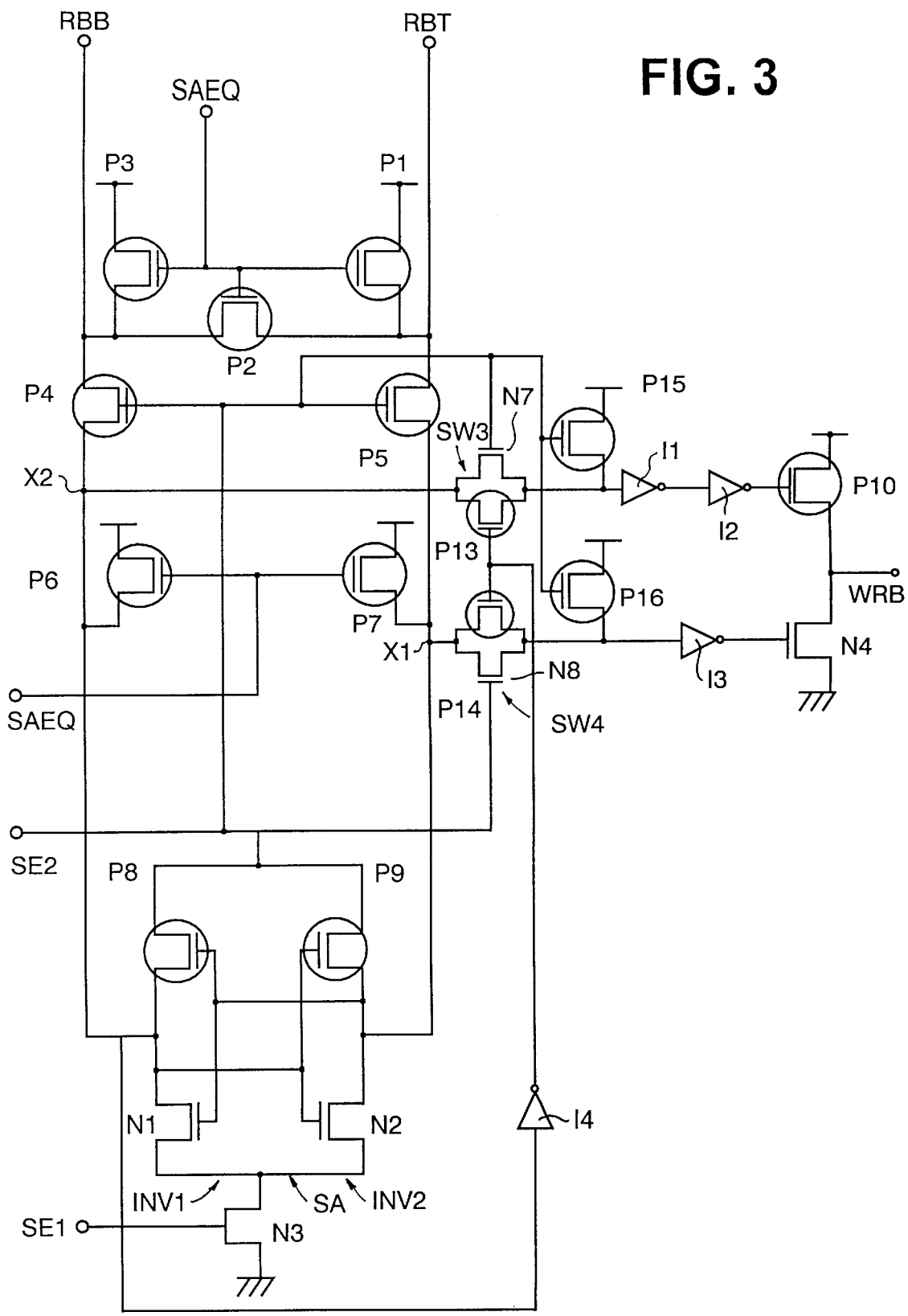
FIG. 3 is a circuit diagram illustrative of a second novel sense amplifier circuit in a second embodiment in accordance with the present invention.

Second Embodiment:

A second embodiment according to the present invention will be described in detail with reference to FIG. 3 which is a circuit diagram illustrative of a second novel sense amplifier circuit. The following descriptions will focus on differences from those of the first embodiment.

Between the input and output portions X2 and X1 of the sense amplifier SA and the invertors I1 and I3, a third transfer switch SW3 and a fourth transfer circuit SW4 are provided. The third transfer switch SW3 comprises a parallel connection of a p-channel MOS field effect transistor P13 and an n-channel MOS field effect transistor N7. The fourth transfer switch SW4 comprises a parallel connection of a p-channel MOS field effect transistor P14 and an n-channel MOS field effect transistor N8. Gates of the n-channel MOS field effect transistors N7 and N8 receive the signal SE2. Gates of the p-channel MOS field effect transistors P13 and P14 receive an inverted signal to the signal SE2 through an invertor I4. Further, a p-channel MOS field effect transistor P15 is connected in series between a high voltage line and an input side of the invertor I2. A p-channel MOS field effect transistor P16 is connected in series between the high voltage line and an input side of the invertor I3. Gates of the p-channel MOS field effect transistors P15 and P16 receive the signal SE2.

Before the read bus lines RBT and RBB are opened, the third and fourth transfer switches SW3 and SW4 turn OFF so that the invertors I1 and I3 are disconnected from the input and output portions X2 and X1 of the sense amplifier SA, whereby the loads to the read bus lines RBT and RBB are reduced and the openings of the read bus lines RBT and RBB are enlarged. This results in that the signal SE2 is changed from the low level "L" to the high level "H" and the openings of the read bus lines RBT and RBB in activation of the sense amplifier SA become large. This improves the high speed performance of the output operation to the output line WRB after the sense amplifier circuit SA was activated. When the sense amplifier circuit SA is inactivated and the third and fourth transfer switches SW3 and SW4 are in the OFF states, input terminals of the invertors I1 and I3 are pre-charged by the p-channel MOS field effect transistors P15 and P16 and no output signal appears on the output line WRB. This novel sense amplifier circuit is improved in the high speed performance by 110 ps as compared to the conventional sense amplifier circuit.

The above novel sense amplifier circuit has the circuit configuration for returning the output from the invertor connected to the output terminal of the sense amplifier to the sense amplifier when the sense amplifier is activated, whereby the sense amplifier circuit becomes to have the two parallel connection of the two invertor circuits. As a result, the invertor size in the sense amplifier is apparently enlarged. This makes it possible to improve the high speed performance of the output on the output line WRB as omitting the invertor on the single output stage. Further, when the sense amplifier is inactivated, the invertor is disconnected from the output of the sense amplifier so as to reduce the load to the read bus line whereby when the sense amplifier is activated, then the opening of the read bus line is enlarged to improve the high speed performance of the output operation to the output line after the sense amplifier circuit was activated.

Figure 4:
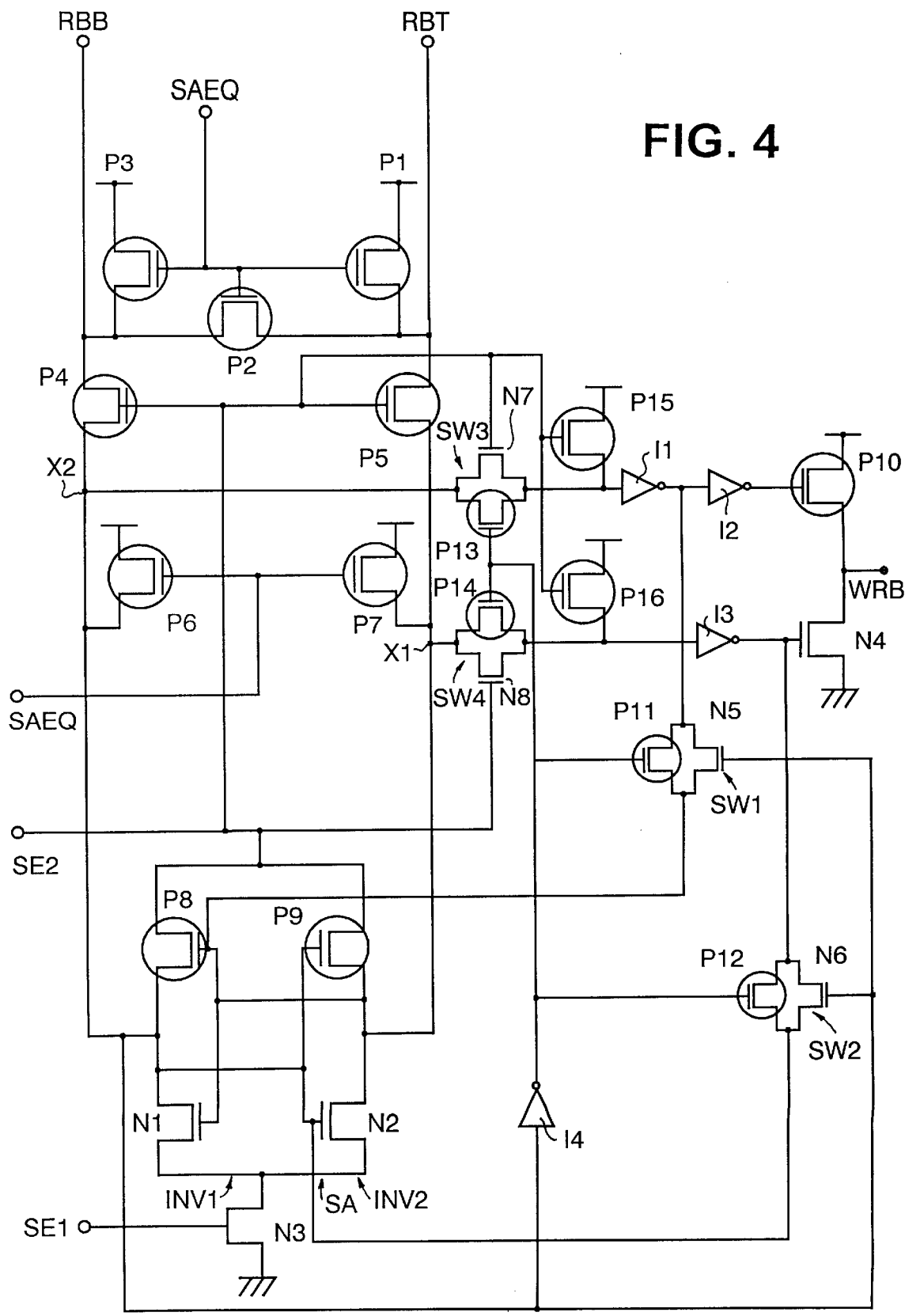
FIG. 4 is a circuit diagram illustrative of a third novel sense amplifier circuit in a third embodiment in accordance with the present invention.

Third Embodiment:

A third embodiment according to the present invention will be described in detail with reference to FIG. 4 which is a circuit diagram illustrative of a third novel sense amplifier circuit. The following descriptions will focus on differences from those of the first embodiment.

Output terminals of the invertors I1 and I3 are connected to first and second transfer switches SW1 and SW2. The first transfer switch SW1 comprises a parallel connection of a p-channel MOS field effect transistor P11 and an n-channel MOS field effect transistor N5. The second transfer switch SW2 comprises a parallel connection of a p-channel MOS field effect transistor P12 and an n-channel MOS field effect transistor N6. A first side of the parallel connection of the first transfer switch SW1 is connected to the output terminal of the invertor I1 and a second side of the parallel connection of the first transfer switch SW1 is connected to an output terminal of the first invertor circuit INV1. A second side of the parallel connection of the second transfer switch SW2 is connected to the output terminal of the invertor I3 and a second side of the parallel connection of the second transfer switch SW2 is connected to an output terminal of the second invertor circuit INV2. Gates of the n-channel MOS field effect transistors N5 and N6 receive the signal SE2. Gates of the p-channel MOS field effect transistors P11 and P12 receive an inverted signal to the signal SE2 through an invertor I4. When the first and second transfer switches SW1 and SW2 turn ON, the output terminals of the invertors I1 and I3 are connected to the input sides of the first and second invertor circuits INV1 and INV2 respectively.

Between the input and output portions X2 and X1 of the sense amplifier SA and the invertors I1 and I3, a third transfer switch SW3 and a fourth transfer circuit SW4 are provided. The third transfer switch SW3 comprises a parallel connection of a p-channel MOS field effect transistor P13 and an n-channel MOS field effect transistor N7. The fourth transfer switch SW4 comprises a parallel connection of a p-channel MOS field effect transistor P14 and an n-channel MOS field effect transistor NS. Gates of the n-channel MOS field effect transistors N7 and N8 receive the signal SE2. Gates of the p-channel MOS field effect transistors P13 and P14 receive an inverted signal to the signal SE2 through an invertor I4. Further, a p-channel MOS field effect transistor P15 is connected in series between a high voltage line and an input side of the invertor I2. A p-channel MOS field effect transistor P16 is connected in series between the high voltage line and an input side of the invertor I3. Gates of the p-channel MOS field effect transistors P15 and P16 receive the signal SE2.

Before the read bus lines RBT and RBB are opened, the third and fourth transfer switches SW3 and SW4 turn OFF so that the invertors I1 and I3 are disconnected from the input and output portions X2 and X1 of the sense amplifier SA, whereby the loads to the read bus lines RBT and RBB are reduced and the openings of the read bus lines RBT and RBB are enlarged. This results in that the signal SE2 is changed from the low level "L" to the high level "H" and the openings of the read bus lines RBT and RBB in activation of the sense amplifier SA become large. This improves the high speed performance of the output operation to the output line WRB after the sense amplifier circuit SA was activated. When the sense amplifier circuit SA is inactivated and the third and fourth transfer switches SW3 and SW4 are in the OFF states, input terminals of the invertors I1 and I3 are pre-charged by the p-channel MOS field effect transistors P15 and P16 and no output signal appears on the output line WRB.

The sense amplifier SA is activated and concurrently the first and second transfer switches SW1 and SW2 turn ON, whereby the outputs of the invertors I1 and I3 become connected to the inputs of the first and second invertor circuits INV1 and INV2. As described above, the activated sense amplifier SA becomes to have a full-latch sense amplifier circuit configuration which comprises a first parallel connection of the first invertor circuit INV1 and the invertor I3 and a second parallel connection of the second invertor circuit INV2 and the invertor I1. Data are defined. The output from the sense amplifier SA is transferred through the invertors I1, I2 and I3 to the gates of the p-channel MOS field effect transistor P10 and the n-channel MOS field effect transistor N4, whereby an output high "H" or low "L" appears on the output line WRB.

In the above novel sense amplifier circuit, when the sense amplifier SA is activated, this sense amplifier becomes to have parallel connections of the two invertors, whereby the invertor size is apparently enlarged. This makes it possible to improve the high speed performance of the output on the output line WRB as omitting the invertor on the single output stage.

The above novel sense amplifier circuit has the circuit configuration for returning the output from the invertor connected to the output terminal of the sense amplifier to the sense amplifier when the sense amplifier is activated, whereby the sense amplifier circuit becomes to have the two parallel connection of the two invertor circuits. As a result, the invertor size in the sense amplifier is apparently enlarged. This makes it possible to improve the high speed performance of the output on the output line WRB as omitting the invertor on the single output stage. Further, when the sense amplifier is inactivated, the invertor is disconnected from the output of the sense amplifier so as to reduce the load to the read bus line whereby when the sense amplifier is activated, then the opening of the read bus line is enlarged to improve the high speed performance of the output operation to the output line after the sense amplifier circuit was activated.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A circuitry comprising:
   at least a sense amplifier comprising at least a pair of invertor circuits having output sides connected to output invertors; and
   a control circuit connected to the sense amplifier and the output invertors for performing at least one of the following operations:
   returning output signals from the output invertors to the sense amplifier when the sense amplifier is activated; and
   disconnecting the output invertors from the sense amplifier when the sense amplifier is inactivated.

2. The circuitry as claimed in claim 1, wherein the control circuit comprises at least a switching circuit connected between one of the output sides of the invertor circuits and an input terminal of one of the output invertors.

3. The circuitry as claimed in claim 1, wherein the control circuit comprises at least a first switching circuit connected between a first read bus line connected to an input side of the sense amplifier and an input side of one of the output invertors and a second switching circuit connected between a second read bus line connected to an output side of the sense amplifier and an input side of the other of the output invertors, so that the first and second switching circuits are operated to disconnect the output invertors from the sense amplifier when the sense amplifier is inactivated.

4. The circuitry as claimed in claim 1, wherein the control circuit comprises:
   a first switching circuit connected between a first output terminal of the sense amplifier and an output terminal of the first output invertor;
   a second switching circuit connected between a second output terminal of the sense amplifier and an output terminal of the second output invertor;
   a third switching circuit connected between a first read bus line connected to an input side of the sense amplifier and an input terminal of the first output invertor; and
   a fourth switching circuit connected between a second read bus line connected to an output side of the sense amplifier and an input terminal of the second output invertor,
   so that the first, second, third and fourth switching circuits are operated to turn ON when the sense amplifier is activated and turn OFF when the sense amplifier is inactivated.

* * * * *